US012660532B2

(12) United States Patent
Legallais et al.

(10) Patent No.: US 12,660,532 B2
(45) Date of Patent: Jun. 16, 2026

(54) METHOD FOR PRODUCING A DIELECTRIC LAYER ON A STRUCTURE MADE OF MATERIALS III-V

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Heres (FR)

(72) Inventors: Maxime Legallais, Grenoble Cedex (FR); Bassem Salem, Grenoble Cedex (FR); Thierry Baron, Grenoble Cedex (FR); Romain Gwoziecki, Grenoble Cedex (FR); Marc Plissonnier, Grenoble Cedex (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 536 days.

(21) Appl. No.: 18/004,362

(22) PCT Filed: Jul. 8, 2021

(86) PCT No.: PCT/EP2021/069075
§ 371 (c)(1),
(2) Date: Jan. 5, 2023

(87) PCT Pub. No.: WO2022/008690
PCT Pub. Date: Jan. 13, 2022

(65) Prior Publication Data
US 2023/0290633 A1     Sep. 14, 2023

(30) Foreign Application Priority Data

Jul. 9, 2020     (FR) ........................................ 2007279

(51) Int. Cl.
H01L 21/02        (2006.01)
H10P 14/60        (2026.01)
H10P 14/692       (2026.01)

(52) U.S. Cl.
CPC .... *H10P 14/69391* (2026.01); *H10P 14/6336* (2026.01); *H10P 14/6339* (2026.01)

(58) Field of Classification Search
None
See application file for complete search history.

(56) References Cited

U.S. PATENT DOCUMENTS

2010/0117118 A1*     5/2010     Dabiran ............. H10D 30/4755
257/190
2011/0003482 A1     1/2011     Ogawa et al.
(Continued)

OTHER PUBLICATIONS

International Search Report & Written Opinion issued Sep. 30, 2021 in PCT/EP2021/069075 filed on Jul. 8, 2021, 11 pages.
(Continued)

*Primary Examiner* — Asok K Sarkar
(74) *Attorney, Agent, or Firm* — Oblon, McClelland, Maier & Neustadt, L.L.P.

(57)     ABSTRACT

A method for producing, on a structure based on a material III-V, of a dielectric layer, the method comprising producing a first dielectric film by ALD by carrying out a plurality of first cycles, each comprising at least: one injection in the reaction chamber of a precursor based on a first material and one injection in the reaction chamber of a water or ozone-based precursor; and producing, on the first dielectric film, a second dielectric film by plasma-enhanced ALD by carrying out a plurality of second cycles, each comprising at
(Continued)

least: one injection in the reaction chamber of a precursor based on a second material and one injection in the reaction chamber of an oxygen or nitrogen based precursor.

23 Claims, 8 Drawing Sheets

(56)                    References Cited

U.S. PATENT DOCUMENTS

| | | |
|---|---|---|
| 2013/0140605 A1* | 6/2013 | Ramdani ............ H01L 21/02315 |
| | | 257/192 |
| 2015/0137138 A1 | 5/2015 | Araki et al. |
| 2016/0013282 A1 | 1/2016 | Murakami et al. |
| 2018/0096886 A1 | 4/2018 | Reddy et al. |

OTHER PUBLICATIONS

Vauche et al., "Study of an $Al_2O_3$/GaN Interface for Normally Off MOS-Channel High-Electron-Mobility Transistors Using XPS Characterization: The Impact of Wet Surface Treatment on Threshold Voltage $V_{TH}$", ACS Applied Electronic Materials, vol. 3, Mar. 23, 2021, 8 pages.

Beladiya et al., "Controlling mechanical, structural and optical properties of $Al_2O_3$ thin films deposited by plasma-enhanced atomic layer deposition with substrate biasing", Proceedings of SPIE, Advances in Optical Thin Films VI, vol. 10691, 2018, 14 pages.
Campabadal et al., "Comparison between $Al_2O_3$ thin films grown by ALD using $H_2O$ or $O_3$ as oxidant source", Proceedings of the 8th Spanish Conference on Electron Devices, CDE'2011, 2011, 4 pages.
Fletcher et al., "A survey of Gallium Nitride HEMT for RF and high power applications", Superlattices and Microstructures 109, 2017, 19 pages.
Ha et al., "Influence of oxidant source on the property of atomic layer deposited $Al_2O_3$ on hydrogen-terminated Si substrate", Thin Solid Films 476, 2005, 6 pages.
Hashizume et al., "State of the art on gate insulation and surface passivation for GaN-based power HEMTs", Materials Science in Semiconductor Processing 78, 2018, 11 pages.
Meunier et al., "AlGaN/GaN MIS-HEMT gate structure improvement using $Al_2O_3$ deposited by plasma-enhanced ALD", Microelectronic Engineering 109, 2013, 3 pages.
Profijt et al., "Substrate-biasing during plasma-assisted atomic layer deposition to tailor metal-oxide thin film growth", J. Vac. Sci. Technol. A 31(1), 2013, 10 pages.
Qin et al., "In situ plasma enhanced atomic layer deposition half cycle study of $Al_2O_3$ on AlGaN/GaN high electron mobility transistors", Applied Physics Letters 107, 2015, 6 pages.

* cited by examiner

METHOD FOR PRODUCING A DIELECTRIC LAYER ON A STRUCTURE MADE OF MATERIALS III-V

TECHNICAL FIELD OF THE INVENTION

The present invention relates to the production of a dielectric layer, for example alumina ($Al_2O_3$)-based on a structure, such as a layer or nanostructures based on materials III-V. It has, for example, an advantageous application in the field of microelectronics, and more specifically in the fields of power electronics, sensors and optoelectronics.

One of the particularly advantageous applications relates to alumina gate dielectrics for manufacturing high-electron-mobility transistors (HEMTs).

STATE OF THE ART

Alumina is a gate dielectric conventionally used for gallium nitride (GaN)-based HEMTs.

Usually, the production of an alumina layer is done by atomic layer deposition, usually referred to as ALD. ALD techniques are based on a self-limiting growth method, wherein the material is deposited layer-by-layer. It is thus possible to design nanometric scale films.

Generally, the ALD technique consists of sequentially injecting precursors of a first species (reagent A), then precursors of a second species (reagent B) in the reaction chamber of a reactor. FIG. 1 illustrates different steps of an example of an ALD deposition cycle 1.

A first step 10 consists of injecting the reagent A which reacts with the uncovered surface of the substrate by chemisorption. Then, a purging step 20 is carried out to remove the reagents A not having reacted, as well as the reactional products. Then, the reagent B is injected 30, which reacts with the uncovered surface by chemisorption. Then, a purging step 40 is carried out to remove the reagents B not having reacted, as well as the reactional products.

To obtain a layer of desired thickness, this cycle 1 is repeated sequentially. In FIG. 1, the dotted arrow and the number N illustrate this iterative character and the number of cycles carried out.

The deposition of alumina ($Al_2O_3$) by ALD, can be done;
either by so-called "thermal" ALD, in this case, the oxygen-based precursor is water ($H_2O$) or ozone ($O_3$);
or by so-called "plasma" ALD, in this case, the oxygen-based precursor is a dioxygen ($O_2$)-based plasma.

Document US 2015/0137138 A1 discloses a method for manufacturing a transistor comprising the deposition, on a GaN layer surmounted by an AlGaN layer, of a first gate layer and a second alumina gate layer.

Document US2016/0013282 A1 discloses a deposition method, on a GaN layer, of a gate layer and a second gate layer, for example made of alumina.

The properties of the alumina layers deposited however remain improvable.

Despite the existence of these known ALD deposition techniques, there remains a need consisting of proposing a solution making it possible to improve the properties of a dielectric layer, such as an alumina layer deposited by ALD.

More generally, there remains a need consisting of proposing a solution making it possible to improve the properties of a dielectric layer deposited on a layer or nanostructures based on materials III-V, in particular based on materials III-N and in particular, GaN-based.

An aim of the present invention consists of meeting at least one of these needs.

SUMMARY OF THE INVENTION

To achieve this aim, according to an embodiment, a method is provided for producing, on a structure based on a material III-V, a dielectric layer comprising at least one dielectric material which can be deposited by atomic layer deposition (ALD) by using a water ($H_2O$)—, ozone ($O_3$)— or dioxygen ($O_2$)-based precursor. The method comprises the following sequences carried out in a plasma reactor comprising a reaction chamber inside which said structure is deposited:

producing a first dielectric film by ALD by carrying out a plurality of first cycles, each comprising at least:
one injection in the reaction chamber of a precursor based on a first material,
one injection in the reaction chamber of a water ($H_2O$)— or ozone ($O_3$)-based precursor. The first dielectric film comprises at least the first material and oxygen.
producing, on the first dielectric film, a second dielectric film by plasma-enhanced ALD by carrying out a plurality of second cycles, each comprising at least:
one injection in the reaction chamber of a precursor based on a second material,
one injection in the reaction chamber of a precursor based on a given species, taken from among oxygen and nitrogen and the formation in the reaction chamber of a plasma based on said species, the second dielectric film comprising at least the second material and said species.

It has been observed that, surprisingly, the dielectric layer thus composed of a "thermal" film surmounted by a "plasma" film has significantly improved electric properties. Moreover, the quality of the interface between this dielectric layer and the structure which itself is underlying is also clearly improved.

It is probable that these unexpected results are, on the one hand, due to the fact that the thermal dielectric film plays the role of a protective layer vis-à-vis the surface of the underlying structure and, on the other hand, that the deposition in plasma mode makes it possible to improve the electric features of the overall dielectric layer. More specifically, the film deposited in thermal mode limits the oxidation by the plasma of the exposed surface of the underlying structure. On the contrary, it would seem that the deposition in plasma mode oxidises and passivates the underlying structure.

For example, in the case of producing an alumina layer on GaN, the thermal alumina avoids, even prevents, the oxidation of the exposed GaN layer at the $Al_2O_3$/GaN interface, while the plasma alumina would tend to oxidise the GaN. Furthermore, in the presence of a consequent thickness of plasma alumina in the dielectric layer makes it possible to improve the electric properties of the latter.

Preferably, in the plurality of first cycles, a precursor based on or made of water ($H_2O$) is injected in the reaction chamber. The water-based precursor is less oxidising than an ozone-based precursor, and therefore less reactive with the underlying layer. During the development of the invention, it has been highlighted, surprisingly, that the water-based precursor made it possible to limit and preferably avoid a degradation of the underlying layer of the structure with respect to the current solutions, in particular those implementing an ozone-based precursor. The properties of the dielectric layer deposited on the underlying layer based on materials III-V, as well as the interface between these layers, are improved.

Optionally, the method can further have at least any one of the following features which can be taken separately or combined:

According to an example, the first material is identical to the second material. Alternatively, the first material is different from the second material.

According to an example, the plasma based on said species is an oxygen (O)-based plasma created from a precursor constituted of dioxygen ($O_2$) or comprising dioxygen ($O_2$).

According to an example, the plasma based on said species is a nitrogen (N)-based plasma created from a precursor constituted of dinitrogen ($N_2$) or comprising dinitrogen ($N_2$).

According to an example, at least one from among the first material and the second material is taken from among one of the following materials: aluminium (Al), titanium (Ti), tantalum (Ta), zirconium (Zr), hafnium (Hf), silicon (Si).

According to an example, the first dielectric film is taken from among the following materials: $Al_2O_3$, $HfO_2$, $TiO_2$, $Ta_2O_5$, $ZrO_2$, $SiO_2$, and SiN.

According to an example, the second dielectric film is taken from among the following materials: $Al_2O_3$, $HfO_2$, $TiO_2$, $Ta_2O_5$, $ZrO_2$, $SiO_2$, SiN and AlN.

According to an example, the first material and the second material are aluminium, the first dielectric film and the second dielectric film are made of $Al_2O_3$.

According to an example, the precursor based on the first material and the precursor based on the second material are taken from among trimethylaluminium and aluminium trichloride.

According to an example, the first dielectric film has a thickness $e_{71A}$, and the second dielectric film has a thickness $e_{71b}$, with $e_{71A} < e_{71B}$. Preferably, $e_{71A}$, is between 0.5 and 2 nm.

Preferably, $e_{71B} > 1.5*e_{71A}$, and preferably $e_{71B} > 3*e_{71A}$. According to an example, the first dielectric film has a thickness $e_{71A}$, such that $e_{71A} \geq 0.5$ nm. This thickness makes it possible to effectively limit the oxidation of the surface of the structure underlying the electric layer.

According to an example, the first dielectric film has a thickness $e_{71A}$, such that $e_{71A} \leq 2$ nm ($10^{-9}$ metres). This thickness makes it possible for the features of the dielectric layer to be mainly dictated by the layer produced by plasma deposition. According to an example, the thickness of the first dielectric film is strictly less than 2 nm, and preferably less than or equal to 1.7 nm. Surprisingly, a thickness strictly less than 2 nm, and preferably less than or equal to 1.7 nm, makes it possible to obtain satisfactory electric qualities for the layer 71.

According to an example, the second dielectric film has a thickness $e_{71B}$, such that $e_{71B} \geq 5$ nm. This thickness makes it possible for the features of the dielectric layer to be mainly dictated by the layer produced by plasma deposition.

According to an example, each second cycle comprises, at least one step of purging the reaction chamber, the purging step comprising the injection in the reaction chamber of a neutral gas, the at least one purging step being carried out at at least one and preferably each of the following moments:

after the injection of the precursor based on the second material and before the formation of the plasma, and after the formation of the plasma.

According to an example, each second cycle comprises, at least one step of stabilising the gases present in the reaction chamber, the stabilisation step being carried out at least before the formation of the plasma.

According to an example, during at least some of the first cycles, and preferably during each first cycle, the injection of the precursor based on the first material is carried out after the injection in the reaction chamber of the water ($H_2O$)— or ozone ($O_3$)-based precursor.

According to an example, during at least some of the second cycles, and preferably during each second cycle, the injection of the precursor based on the second material is carried out after the injection in the reaction chamber of the precursor based on the given species and the formation in the reaction chamber of a plasma.

According to an example, the structure is one taken from among: a layer, a three-dimensional structure, a plurality of three-dimensional structures.

According to an example, the structure is based on a material taken from among the materials III-N. According to an example, the material can be GaN. Thus, the structure is made of GaN or is GaN-based.

According to an example, the second dielectric film is formed directly in contact with the first dielectric film. According to an example, the first dielectric film is formed directly in contact with the structure.

According to an example, the structure is a layer. It has, for example, a face which extends over the whole plate. It can have a flat face. Alternatively, it can mould the shape of raised parts which are underlying.

According to another example, the structure may not be a layer. It can comprise a nanostructure or a plurality of nanostructures. A nanostructure is a structure, at least one dimension of which is less than 1 millimetre, and preferably less than 500 nm ($10^{-9}$ metres) and preferably less than 100 nm. A nanostructure can be three-dimensional (3D). It can, for example, be a terminal or a wire extending in a main direction perpendicular to a face of the support substrate and having, in a plane perpendicular to this main direction, a section less than 1 millimetre, preferably less than 500 nm, and preferably less than 100 nm. The nanostructure can also be a trench or a ridge. It can also be a structure intended to form part of or to form a device that is a transistor or a micromechanical or electromechanical device (MEMS, NEMS, etc.) or also an optical or optoelectronic device (MOEMS, etc.). The nanostructure is isolated. It does not extend over the whole plate. Thus, a face of the plate extends mainly in a plane and nanostructures extend from this face and in a direction perpendicular to this plane. These nanostructures are therefore discontinuous.

According to an example, the structure is disposed on a substrate located in the reaction chamber, and, during the formation of the plasma, a polarisation voltage $V_{bias}$ is applied to the substrate, below called $V_{bias-substrat}$, preferably non-zero.

Thanks to this control of the polarisation of the substrate, the energy of the ions which arrive on the exposed surface of the substrate is fully controlled. Unexpectedly and particularly advantageously, the polarisation of the structure during the injection of the precursor based on the given species makes it possible to considerably improve the quality of the second dielectric layer.

The application of a polarisation voltage $V_{bias-substrat}$ to the substrate makes it possible to increase the energy of the ions of the plasma controllably and independently of the polarisation voltage $V_{plasma}$ induced by the source used to generate the plasma. The effectiveness of the treatment by plasma can thus be modulated controllably to further improve the properties of the interface obtained. The electric performance of the component is consequently improved.

For the preparation of a transistor, the active layer of which is based on a material III-V, the method avoids, in particular, offsetting the threshold voltage to negative voltages, and improves the slope under the threshold. The method is thus particularly advantageous for the preparation of transistors, in particular of power transistors, having good electric properties. In particular, when the structure is made of GaN and is intended to form at least some of a GaN-based device such as an HEMT, the application of a polarisation voltage thus makes it possible to considerably increase the performance of such devices. Such is the case, when the dielectric layer forms a gate dielectric for these types of transistors.

According to an example, the polarisation voltage $V_{bias\_substrat}$ is controlled independently of a voltage $V_{plasma}$ induced by a source of said plasma.

According to an example, the absolute value of the polarisation voltage $|V_{bias\text{-}substrat}|$ is less than or equal to 160 Volts.

According to an example, the absolute value of the polarisation voltage $|V_{bias\text{-}substrat}|$ is greater than or equal to 10 Volts.

According to an example, which $|V_{bias\text{-}substrat}|$ is between 10 Volts and 130 Volts and preferably $V_{bias\text{-}substrat}$ is between –10 Volts and –130 Volts.

According to an example, $|V_{bias\text{-}substrat}|$ is equal to 85 Volts.

According to an example, the polarisation voltage $V_{bias\text{-}substrat}$ is applied for at least 70%, and preferably 90%, of the duration $T_O$ of the formation of the plasma. According to an example, the polarisation voltage $V_{bias\text{-}substrat}$ is applied for the whole duration $T_O$ of the formation of the plasma.

According to an example, the polarisation voltage $V_{bias\_substrat}$ is not applied during the injection in the reaction chamber of the precursor based on the second material. Preferably, the polarisation voltage $V_{bias\_substrat}$ is applied only during the plasma formation. Alternatively, $V_{bias\_substrat}$ is applied for the whole duration of each second cycle.

According to an example, which each first and second cycle comprises, at least one step of purging the reaction chamber, the purging step comprising the injection in the reaction chamber of a neutral gas, the at least one purging step being carried out at at least one and preferably at each of the following moments:

after the injection of the precursor based on the first material,
    after the injection of the water-based precursor,
    after the injection of the precursor based on the second material, and before the formation of the plasma, and
    after the formation of the plasma.

According to an example, the method comprises at least ten first cycles and preferably at least fifty first cycles. Preferably, it comprises at least one hundred first cycles and preferably about five hundred first cycles.

According to an example, the method comprises at least ten second cycles and preferably at least fifty second cycles. Preferably, it comprises at least one hundred second cycles and preferably about five hundred second cycles.

BRIEF DESCRIPTION OF THE FIGURES

The aims, objective, as well as the features and advantages of the invention will best emerge from the detailed description of an embodiment of the latter, which is illustrated by the following accompanying drawings, wherein.

Figure 1:
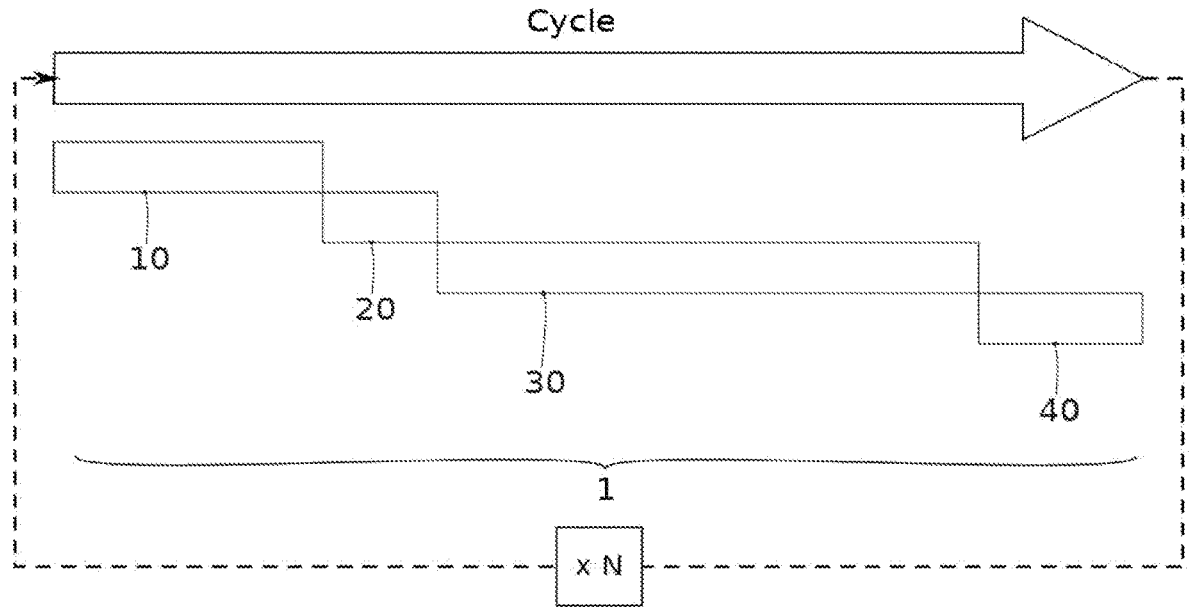
FIG. 1 schematically represents a conventional cycle of an ALD deposition.

The drawings are given as examples and are not limiting of the invention. They constitute principle schematic representations intended to facilitate the understanding of the invention and are not necessarily to the scale practical applications. In particular, in FIG. 3, the thicknesses of the different layers are not representative of reality.

DETAILED DESCRIPTION OF THE INVENTION

By thermal dielectric film, thermal alumina film or thermal alumina, this means respectively a dielectric film, an alumina film, and alumina produced by a so-called thermal deposition.

By plasma dielectric film, plasma alumina film or plasma alumina, this means respectively a dielectric film, an alumina film and alumina produced by a so-called plasma deposition.

By a substrate, a film, a layer, a gaseous mixture, a plasma "with the basis" of a species A, this means a substrate, a film, a layer, a gaseous mixture, a plasma comprising this species A only or this species A and optionally other species. Thus, a substrate comprising a structure such as a layer or nano-structures based on materials III-V can be:

- either, preferably, a stack comprising the structure based on material III-V and a layer, typically a support layer on which the structure rests,
- or a stack only comprising the structure based on material III-V. In this case, the structure can be self-supporting, i.e. that it supports its own weight.

Furthermore, a substrate based on a material III-V also means a substrate, the layer based on the material III-V of which is surmounted by one or more layers deposited during the method described below. Thus, an exposed surface of the substrate based on the material III-V can be a surface formed by the structure or formed by one or more layers or films deposited on the structure.

Moreover, an oxygen-based plasma can be based on a chemistry comprising only dioxygen or comprising dioxygen and optionally one or more other species, for example neutral gases.

Likewise, a nitrogen-based plasma can be based on a chemistry comprising only nitrogen or comprising nitrogen and optionally one or more other species, for example neutral gases.

Fully conventionally, a structure based on a material III-V is a structure made of, or comprising a material comprising at least one species of column III of the periodic table and at least one species of column V of this table. Likewise, a structure based on a material III-N is a structure made of, or comprising a material comprising at least one species of column III of the periodic table and of nitrogen (N). A material III-N can therefore, for example, be taken from among GaN, AlGaN, AlInGaN, InN.

Several embodiments of the invention implementing successive steps of the manufacturing method are described below. Unless explicitly mentioned otherwise, the adjective "successive" does not necessarily imply, even if this is generally preferred, that the steps are immediately followed by intermediate steps which could separate them.

Moreover, the term "step" means the carrying out of some of the method, and can mean a set of substeps.

Moreover, the term "step" does not compulsorily mean that the actions carried out during a step are simultaneous or immediately successive. Some actions of a first step can, in particular be followed by actions linked to a different step, and other actions of the first step can then be resumed. Thus, the term "step" does not necessarily mean single and inseparable actions over time and in the sequence of phases of the method.

The word "dielectric" qualifies a material, the electric conductivity of which is sufficiently low in the given application to serve as an insulator. In the present invention, a dielectric material preferably has a dielectric constant greater than 4. Spacers are typically formed in a dielectric material.

In the present invention, "HEMT (High Electron Mobility Transistor)-type transistors" means field effect transistors with high electron mobility, sometimes called by the term of heterostructure field effect transistor. Such a transistor includes the superposition of two semi-conductive layers having different band gaps which form a quantum well at their interface. Electrons are confined in this quantum well to form a two-dimensional electron gas. For reasons of keeping them at a high voltage and at a temperature, the materials of these transistors are chosen so as to have a wide energy band gap.

By microelectronic device, this means any type of device produced with microelectronic means. These devices comprise, in particular, in addition to devices with a purely electronic purpose, micromechanical or electromechanical devices (MEMS, NEMS, etc.) as well as optical or optoelectronic devices (MOEMS, etc.).

This can be a device intended to ensure an electronic, optical, mechanical, etc. function. This can also be an intermediate product only intended for the production of another microelectronic device.

It is specified that in the scope of the present invention, the thickness of a layer or of the substrate is measured in a direction perpendicular to the surface, according to which this layer or this substrate has its maximum extension. The thickness is thus taken in a direction perpendicular to the main faces of the substrate on which the different layers rest.

It is specified that, in the scope of the present invention, the terms "on", "surmount", "covers", "underlying" "opposite" and their equivalents do not necessarily mean "in contact with". Thus, for example, the deposition, the transfer, the bonding, the assembly or the application of a first layer on a second layer, does not compulsorily mean that the two layers are directly in contact with one another, but means that the first layer covers at least partially the second layer by being either directly in contact with it, or by being separated from it, by at least one other layer or at least one other element.

The terms "substantially", "about", "around" mean "within 10%".

DESCRIPTION OF THE FIGURES

The general principle of the present invention will now be described in reference to FIGS. 2 and 3.

Figure 2:
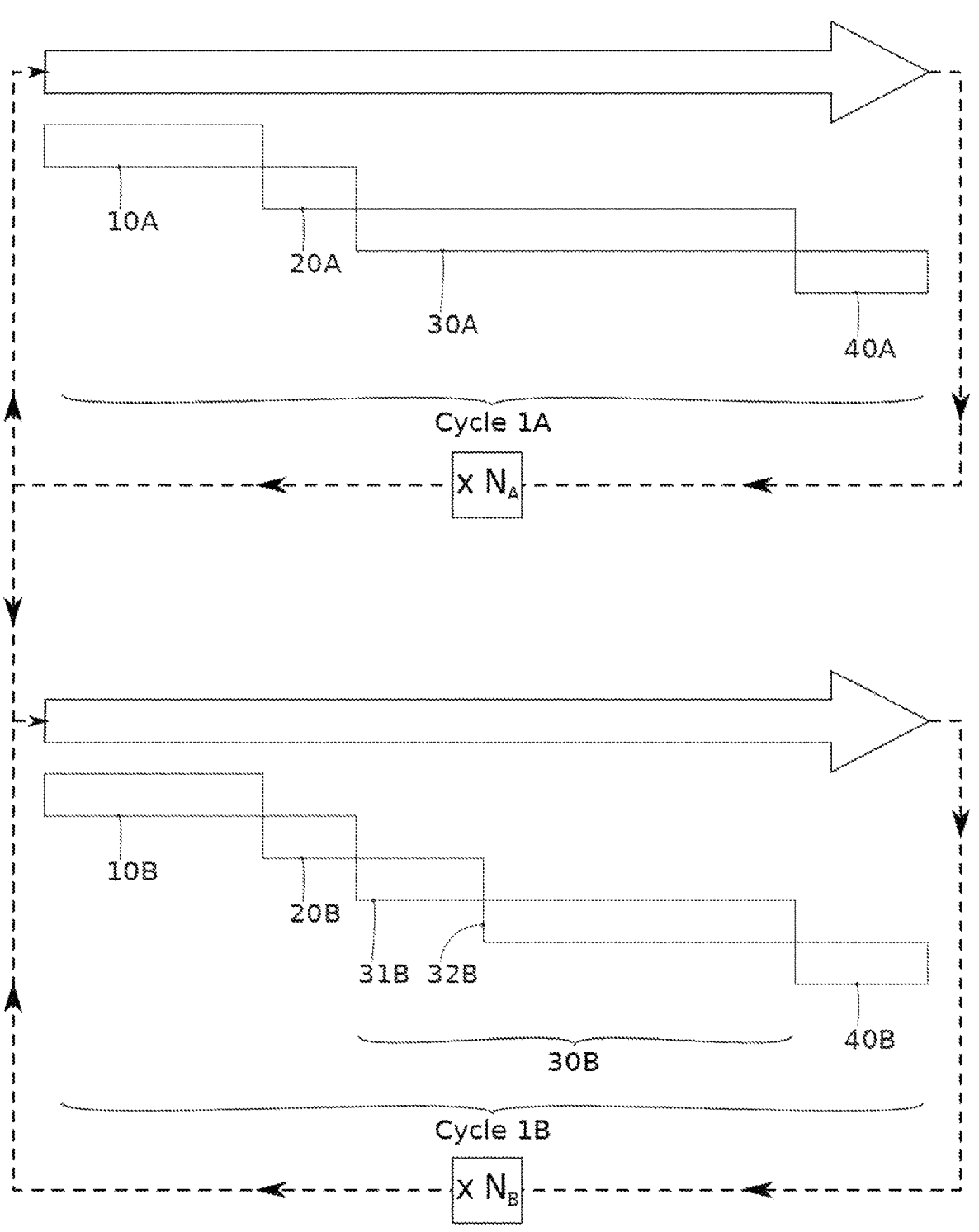
FIG. 2 schematically represents an example of a method according to the invention. This figure shows that this method comprises a first sequence during which a first cycle is repeated, then a second sequence during which a second cycle is repeated.

FIG. 2 illustrates the different steps which occur upon each production of a dielectric layer 71 on a structure 70 based on a material III-V. These steps are repeated several times until this dielectric layer has the desired thickness. FIG. 3 illustrates an example of a structure that can be obtained by implementing the method of FIG. 2.

The method proposed is based on the deposition of the dielectric layer 71 in the form of a stack of two films 71A and 71B thus forming a bilayer 71.

The first film 71A is deposited in so-called "thermal" mode, i.e. with a water ($H_2O$)— or ozone ($O_3$)-based precursor. This first film 71A has the effect of limiting the oxidation of the surface 70' of the structure 70 on which the dielectric layer is deposited. Preferably, a precursor based on or made of water ($H_2O$) is used. The oxidation of the surface 70' of the structure 70 on which the dielectric layer is deposited is thus further limited, water ($H_2O$) being less oxidising than ozone ($O_3$) for the surface 70' of the underlying structure 70.

The second film 71B is deposited in so-called "plasma" mode, i.e. with formation of a plasma. This is a plasma based on a given species, taken from among oxygen (O) and nitrogen (N). The plasma is formed by injection of a gas comprising said species. This can be, for example dioxygen ($O_2$) or dinitrogen ($N_2$). This second film 71B has the advantage of improving the electric properties of the dielectric layer 71 with respect to the thermal deposition. This second film 71B therefore makes it possible to improve the performance of the device comprising this dielectric layer 71.

Preferably, these two films 71A, 71B are produced in situ in one same plasma deposition reactor configured to carry out plasma-enhanced atomic layer depositions (PEALD). An example of a plasma deposition reactor will be described below in reference to FIG. 4.

Before proceeding with the production of these two films 71A, 71B, a substrate comprising the structure 70 intended to receive these two films 71A, 71B is disposed in a reaction chamber of the reactor. Such a structure 70 is based on a material III-V, for example based on a material III-N.

In the non-limiting example illustrated in FIG. 3 and which will be described in detail below, this structure 70 is GaN-based. More specifically, this structure 70 will be described as being a GaN layer. All the features, steps and technical effects which will be described below are fully applicable to a structure based on a material III-V other than GaN. Moreover, all the features, steps and technical effects which will be described below are fully applicable to a structure, possibly other than a layer, such as a nanostructure, for example three-dimensional, or a plurality of such structures.

The substrate can be formed only of this structure 70 made of material III-V. Alternatively, this substrate can comprise a support layer surmounted at least by one such structure 70. The structure 70 has a free surface 70', exposed to the species present in the reaction chamber.

The method comprises the following main sequences and steps illustrated in FIG. 2. The method comprises two sequences.

A first sequence aims to produce the first film 71A deposited in "thermal" mode. A second sequence aims to produce the second film 71B deposited in "plasma" mode.

Each of these sequences is detailed below.

The first sequence comprises the iteration of several cycles referenced 1A in FIG. 2. Each cycle 1A comprises at least the following steps.

A first step comprises the injection 10A in the reaction chamber 210 of a precursor based on a first material. This first material is taken from among one of the following materials: aluminium (Al), titanium (Ti), tantalum (Ta), zirconium (Zr), hafnium (Hf), silicon (Si).

A second step is a purging step 20A. This purge 20A is carried out to remove the excess precursor based on the first material, i.e. to discharge the reagents from the precursor based on the first material which had not reacted, as well as the reactional products. During this purge, neutral gas such as argon (Ar) or dinitrogen ($N_2$) is injected in the reaction chamber. This step, although advantageous, is only optional.

A third step comprises an injection 30A in the reaction chamber 210 of a water ($H_2O$)-based precursor, preferably in the form of vapour. Alternatively or in a combined manner, this can be an injection of an ozone ($O_3$)-based precursor.

A fourth step is a purging step 40A. This purging 40A is carried out to remove the excess water ($H_2O$)-based precursor, as well as the reactional products or ozone ($O_3$).

The solid arrow gives an indication, only as an example, of the relative durations of the cycle and of each of its steps.

It will be noted that the first step and the third step can be reversed, by each being accompanied by a purging step. Also alternatively, as illustrated in FIG. 2, the method can be implemented over the following chronology: 30A, 40A, 10A, 20A.

Each cycle 1A enables the formation of a portion of the "thermal" dielectric film.

During this sequence, this cycle 1A is repeated NA times as illustrated in FIG. 2. At the end of this sequence, the dielectric film 71A produced has a thickness $e_{71A}$.

From this first sequence, and therefore from the last cycle 1A, a second sequence is carried out. This first sequence comprises the iteration of several cycles referenced 1B in FIG. 2. The cycles 1B are carried out after all the cycles 1A have been carried out and completed. Each cycle 1B comprises at least the following steps.

A first step comprises the injection 10B in the reaction chamber 210 of a precursor based on a second material. This second material is taken from among one of the following materials: aluminium (Al), titanium (Ti), tantalum (Ta), zirconium (Zr), hafnium (Hf), silicon (Si).

A second step is a purging step 20B. This purge 20B is carried out to remove the excess precursor based on the second material. Typically, this step comprises the injection in the reaction chamber 210 of a neutral gas.

A third step 30B comprises the injection in the reaction chamber of a precursor based on a given species, then the formation of a plasma 32B, the chemistry of which comprises this species. This species can be oxygen. In this case, the injected gas can, for example, be dioxygen or comprise dioxygen. Alternatively, this species can be nitrogen. In this case, the injected gas can, for example, be dinitrogen or comprise dinitrogen.

This third step 30B, can comprise a phase for stabilising 31B the gases used for the plasma based on a given species. This stabilisation phase 31 is carried out after injection of a precursor based on the given species and before the formation 32B of the plasma.

A fourth step is a purging step 40B. This purge 40B is carried out to remove the excess precursor based on the given species.

It will be noted that the first step and the third step can be reversed by each being accompanied by a purging step. Thus, also alternatively, as illustrated in FIG. 2, the method can be implemented over the following chronology: 30B, 40B, 10B, 20B.

Each cycle 1B enables the formation of a portion of the "plasma" dielectric film.

During this sequence, this cycle 1B is repeated NB times as illustrated in FIG. 2. At the end of this sequence, the dielectric film 71B produced has a thickness $e_{71B}$.

All the purging steps 40A, 20B, 40B can be carried out as described in reference to the purging step 20A.

The plasma sequence is carried out only after the thermal sequence.

Typically, from a cycle, the thickness of the film 71A and 71B formed is less than 1.5 Angström ($10^{-10}$ metres). Preferably, this thickness is less than 1.2 Angström. Preferably, this thickness is between 0.8 Angström and 1.2 Angström.

Particularly advantageously, the dielectric layer 71 thus produced and composed of the thermal film 71A surmounted by the plasma film 71B has significantly improved electric properties. Moreover, the quality of the interface between this dielectric layer 71 and the structure 70 which itself is underlying is also clearly improved. These results seem due to the fact that the thermal dielectric film 71A plays the role of a passivation layer vis-à-vis the surface 70' of the underlying structure 70 and that the plasma dielectric film 71B makes it possible to improve the electric features of the overall dielectric layer. More specifically, the thermal film 71A limits the oxidation by the plasma of the exposed surface 70' of the structure 70. On the contrary, it would seem that the plasma deposition oxidises and passivates the underlying structure 70.

In order to not degrade the electric qualities of the dielectric layer 71, it is preferable that the thickness $e_{71A}$, of the thermal film 71A is less than the thickness of the plasma dielectric film 71B. Thus, $e_{71B} > e_{71A}$. Preferably, $e_{71A} > 0.5$ nm.

Preferably, $e_{71B} > 1.5*e_{71A}$, and preferably $e_{71B} > 3*e_{71A}$. Preferably, $e_{71A}$ is less than or equal to 2 nm. According to an example, the thickness of the first film 71A is strictly less than 2 nm, and preferably less than or equal to 1.7 nm. During the development of the invention, it has been highlighted that, surprisingly, a thickness strictly less than 2 nm, and preferably less than or equal to 1.7 nm, makes it possible to obtain satisfactory electric qualities for the layer 71, for example concerning the mobility of the charge carriers. Preferably, the thickness of the plasma film $e_{71B}$ is greater than or equal to 5 nm. This makes it possible to have an overall dielectric layer having very good electric performance.

Moreover, such that the thermal dielectric film 71A effectively limits the oxidation of the structure 70, it is necessary that its thickness $e_{71A}$ is sufficient. Preferably, $e_{71A}$ 0.5 nm. Preferably, it is equal to 1.2 nm.

According to an optional embodiment, during the formation 32B of the plasma, a polarisation is applied on the structure 70 based on material III-V, in this example, a GaN-based layer. The voltage of this polarisation can be qualified as $V_{bias\_substrat}$, by differentiation with the polarisation voltage $V_{plasma}$ which is induced, fully conventionally, by the plasma source, in order to generate ions and radicals and therefore initiate the dielectric deposition. The polarisation voltage $V_{bias\_substrat}$ is controlled independently of the polarisation voltage $V_{bias\_plasma}$ induced by the source.

In practice, the reaction chamber comprises a plate for receiving the substrate. The plate is electrically conductive and the polarisation voltage $V_{bias-substrat}$ is applied to this plate referenced sample carrier, supporting the substrate. It can thus be said that this voltage is transmitted to the substrate and thus to the structure 70. It will be noted that, the expression "applied to the substrate" means that the polarisation voltage $V_{bias-substrat}$ is applied to the plate on which the substrate rests, that the substrate is conductive or not.

Conventionally, in a remote plasma configuration, the plasma, generated by a main source (ICP or CCP), is remote from the substrate 70. A positive space charge zone called the sleeve is formed between the plasma and the substrate, due to the difference in mobility between heavy ions and electrons. This sleeve quite simply corresponds to the difference between the potential of the plasma $V_{plasma}$ and the potential of the substrate. The polarisation voltage applied to the substrate $V_{bias-substrat}$ can be zero, which is not equivalent to not applying a voltage to the substrate. For example, the substrate can be intrinsically polarised at a different voltage of 0. It is understood with this example, that a polarisation voltage can be applied to the substrate, such that $V_{bias-substrat}$ is equal to 0V. In the scope of the method proposed, a preferably non-zero polarisation is applied on $V_{bias\_substrat}$, for example strictly less than 0 (<0). Therefore, the energy of the ions can be increased/adjusted independently of $V_{plasma}$ since the energy of the ions indeed depends on the voltage of the plasma and on the polarisation voltage of the substrate $V_{bias-substrat}$, according to the following relationship, with q the charge of the ion:

$$E_{ion} = q(V_{plasma} - V_{bias-substrat})$$

The application of this polarisation voltage, $V_{bias-substrat}$ provides considerable advantages. In particular, this polarisation makes it possible to improve the quality of the second film 71B. By applying a non-zero polarisation voltage $V_{bias-substrat}$, the effectiveness of the ion bombardment on the surface can be increased and adjusted, while preserving the surface 70a of the substrate 70. The quality of the second film 71B and the quality of the interface of this second film 71B and the first film 71A are considerably improved. The repeatability of this method is further improved with respect to the current solutions, in particular those resorting to one single plasma source which makes it possible to only control the ion flow reaching the substrate, and therefore playing on $V_{plasma}$.

FIGS. 5B, 6, 8, 9 which will be described below in detail, explain the advantages conferred by the application of this optional polarisation voltage $V_{bias-substrat}$ during the plasma formation step 32B.

According to an example, the applied polarisation voltage $V_{bias-substrat}$ is less than 160 Volts, preferably less than 130 Volts. It will be noted that this polarisation voltage is lower than the polarisation voltages usually used to carry out plasma etchings or implantations. Furthermore, this method is preferably implemented in a deposition plasma reactor. The plasma etching reactors are not configured to apply as low polarisation voltages to the substrate.

Figure 4:
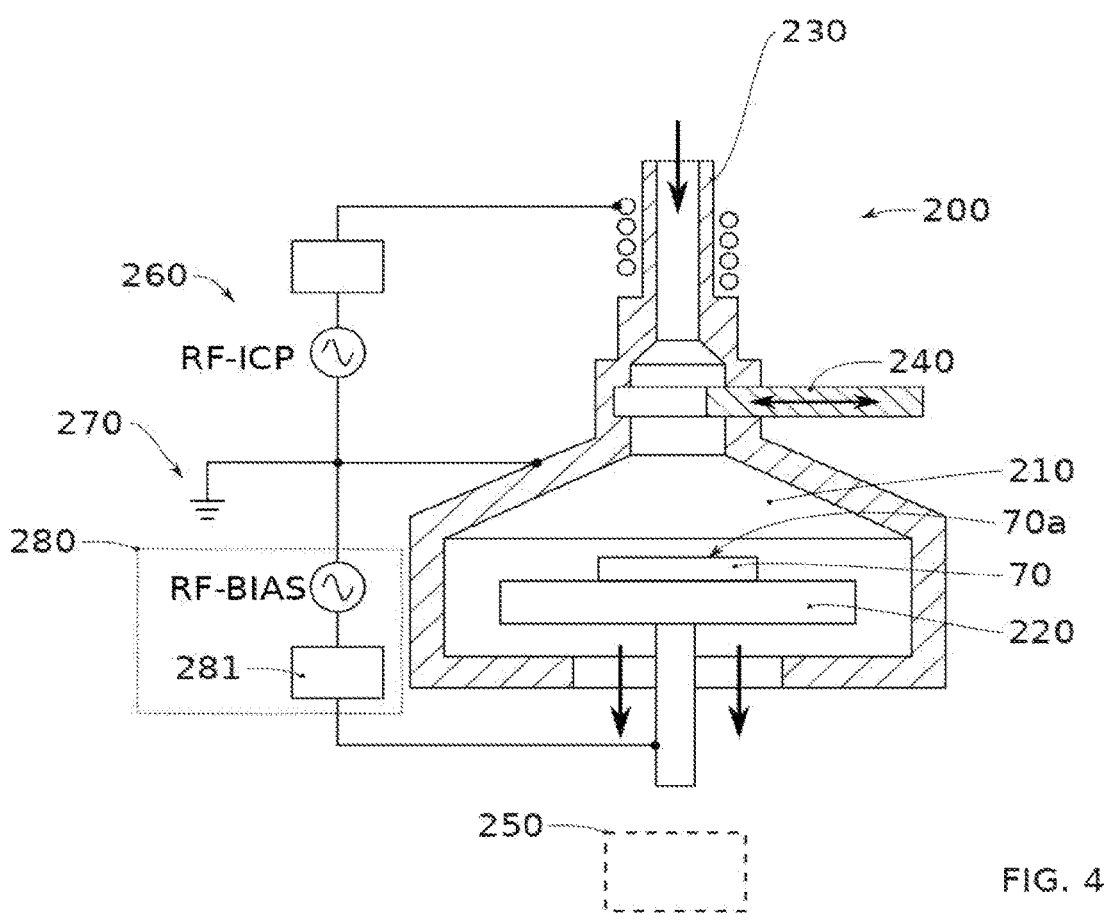
FIG. 4 schematically represents an example of a deposition reactor which could be used to implement the method according to the invention.

Preferably, the polarisation voltage $V_{bias\_substrat}$ is applied only during the nitrogen- or oxygen-based plasma and not during the aluminium-based species deposition. The alumina precursor (TMA, for example) is broken down thermally. Nitrogen or oxygen require a lot more energy and therefore requires a plasma to break it down. Consequently, it is possible to apply $V_{bias\_substrat}$ only during the nitrogen- or oxygen-based plasma. Alternatively, $V_{bias\_substrat}$ is applied during the whole second cycle. FIG. 4 illustrates a diagram of a plasma reactor which can be used to implement the method proposed. Preferably, the thermal mode deposition sequences and in plasma mode are carried out in situ in this same reactor.

Preferably, the method proposed is implemented in a plasma deposition reactor. More specifically, in an inductively coupled plasma (ICP) reactor.

The reactor 200 comprises a reaction chamber 210 inside which a plate 220 is disposed. This plate 220 is configured to receive the substrate. The substrate rests on the plate 220 by a rear surface. The surface 70a of the substrate, opposite its rear surface, is exposed to the species present in the reaction chamber 210. In this non-limiting example, the substrate forms the structure on which it is sought to deposit the dielectric layer, for example an alumina layer. This front surface 70a of the substrate therefore constitutes the surface 70' of the structure 70. The plate 220 is electrically conductive. Relatively conventionally, the reactor comprises a gas inlet 230 making it possible to inject inside the chamber 210, the gases intended to form the chemistry of the plasma, as well as the gases intended for the purging phases. It also comprises an induction coupling device 260, a coil of which is illustrated in FIG. 2, and which enables the formation of the plasma. A wall of the reaction chamber 210 is electrically connected to the earth 270. Conventionally, as appears clearly in this FIG. 4, the plasma source 260 is remote with respect to the reaction chamber 210. Thus, the voltage $V_{plasma}$ is remote from the substrate. This polarisation voltage $V_{plasma}$ is not applied to the substrate.

The reactor 200 also comprises an isolation valve 240 from the reaction chamber 210. The reactor 200 also comprises a pump 250 to extract the species present in the reaction chamber 210.

More specifically, the method is implemented in an inductively coupled plasma (ICP) reactor. Preferably, the source is a radiofrequency inductive source, which makes it possible to have a stable plasma at a lower power P plasma with respect to other sources, for example a microwave source, typically 1500 W to 2000 W. According to an example, the power of the inductive radiofrequency source is between 100 W and 300 W, preferably 300 W.

Advantageously, this reactor 200 comprises a polarisation device 280 configured to enable the application of the polarisation voltage $V_{bias\_substrat}$ to the plate 220. According to an example, this voltage can ultimately be applied to the substrate 70, at least to its rotated face facing the plate 220, that this face is electrically conductive or not. This polarisation device 280 comprises a control device 281 and makes it possible to apply an alternating voltage on the plate 220. Preferably, an auto match unit is provided, which adapts the impedance in the chamber and of the ion source to that of the radiofrequency generator.

This polarisation device 280 is configured to enable the application to the plate 220 of the polarisation voltage $V_{bias\_substrat}$, the amplitude of which is low, typically less than 160 Volts, preferably less than 130 Volts.

The polarisation device 280 and the plasma source 260 are configured so at to be able adjust the polarisation voltage $V_{bias\_substrat}$ applied to the plate 220 independently of the voltage of the plasma $V_{plasma}$ $V_{bias\_substrat}$ and $V_{plasma}$ are independent. $V_{bias\_substrat}$ and $V_{plasma}$ are controlled independently.

The technical effects and advantages of the method proposed will now be described in detail in reference to FIGS. 5A to 9. These FIGS. 5A to 9 illustrate the electric properties of the dielectric layers produced by implementing the method proposed. More specifically, in FIGS. 5A, 5B, 7 and 9, these properties are illustrated by curves from measuring the capacity according to the voltage on Metal-Insulator-Semi-conductor-type capacitive devices. An example of these capacitive devices is illustrated in FIG. 3.

Figure 3:
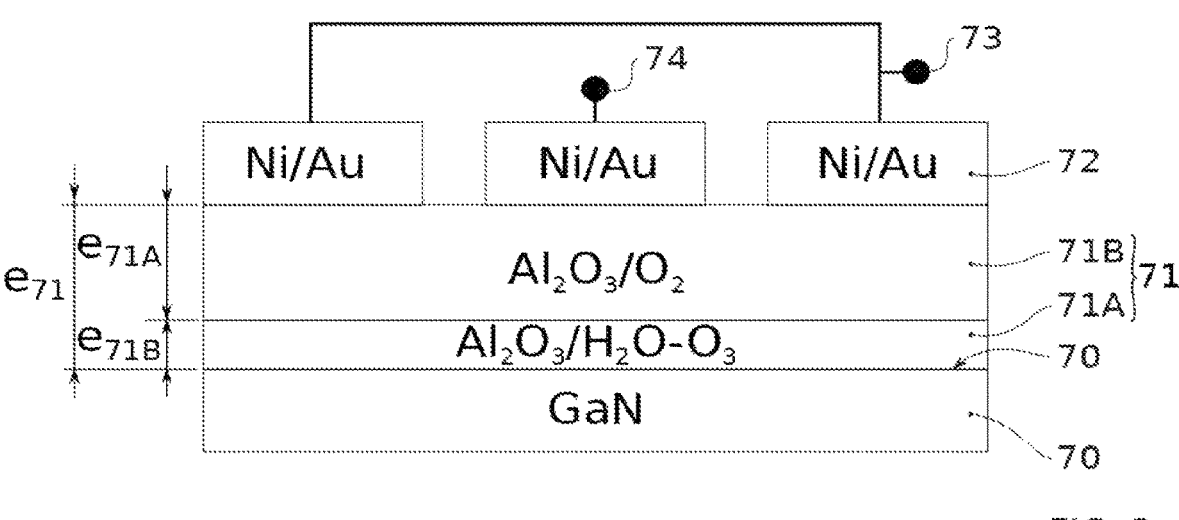
FIG. 3 is a diagram of a Metal-Insulator-Semi-conductive capacitive device comprising metal (nickel/gold) contacts, a dielectric layer, for example alumina, surmounting a structure, for example a GaN layer.

The capacitive device illustrated in FIG. 3 comprises a GaN layer, for example forming said structure 70, assimilable in this example to a substrate. The structure 70 is surmounted, by being preferably directly in contact, by an alumina dielectric layer 71. Thus, the first film 71A is an alumina layer deposited in thermal mode and the second film 71B is an alumina layer deposited in plasma mode. Nickel and gold terminals 72 surmount the alumina layer 71. Pins 73, 74 are placed on the terminals 72 to take the electric measurements.

It will be noted that according to the properties that are sought to highlight in the examples below, the capacitive device illustrated in FIG. 3 can only comprise only one of the films 71A and 71B. Such is the case for the curves of FIGS. 5A, 5B, 6 in particular.

Figures 5A, 5B:
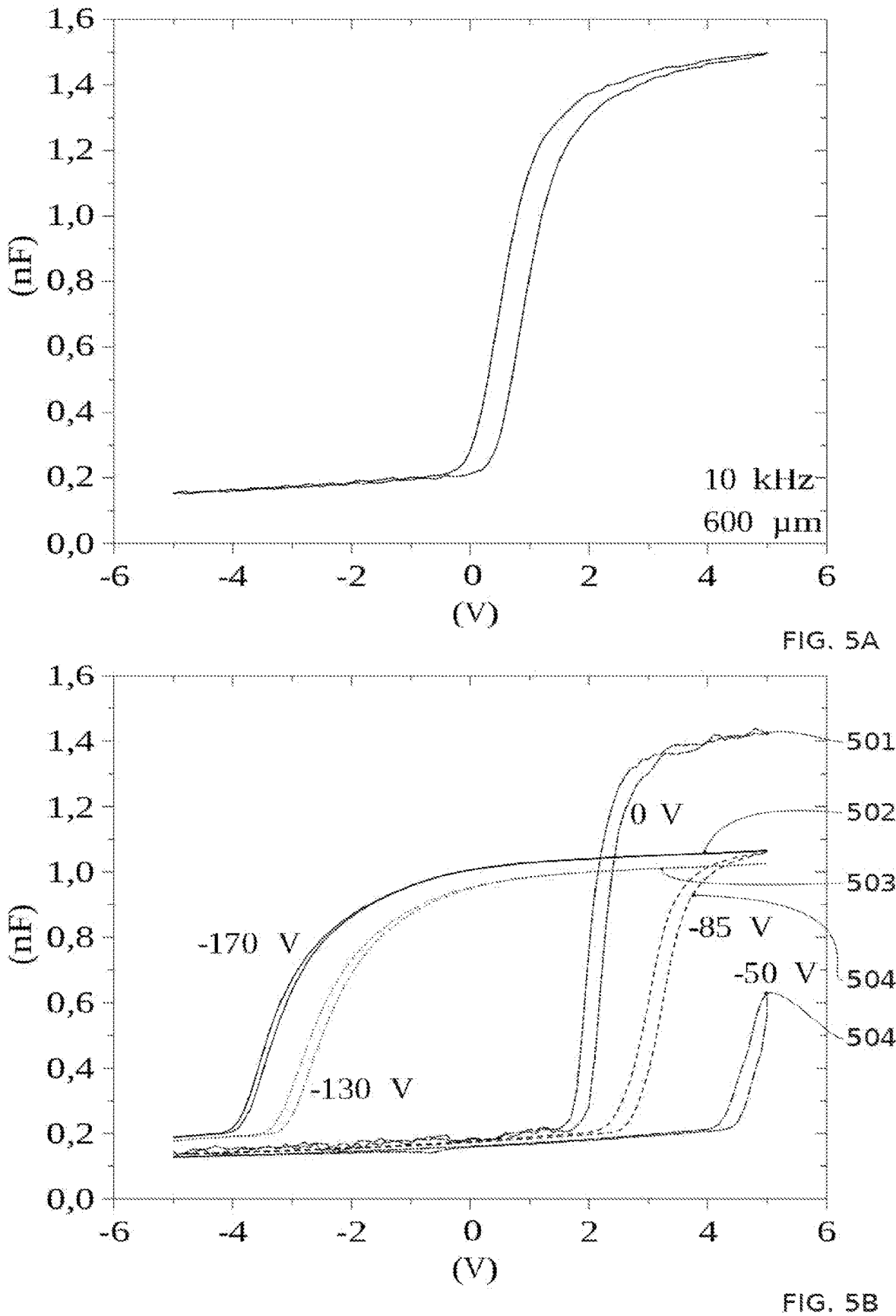
FIG. 5A is a graph illustrating the capacity-voltage (C-V) features of a device such as that of FIG. 3 and comprising only a thermal alumina layer.
FIG. 5B is a graph illustrating the measurements of the capacity-voltage (C-V) features of devices such as that of FIG. 3 and comprising only a plasma alumina layer. These curves also make it possible to compare the impact of the polarisation voltages used for the deposition.

FIGS. 5A and 5B illustrate the capacity-voltage (C-V) feature for a thermal alumina film (FIG. 5A) and for a plasma alumina film (FIG. 5B).

For the plasma alumina, different polarisation voltages, indicated on the curves 501-505, have also been applied. Thus, the curve 501 corresponds to a plasma alumina film deposited with a zero polarisation voltage; the layer 502 corresponds to a plasma alumina film deposited with a polarisation voltage of −170 Volts (V); the curve 503 corresponds to a plasma alumina film deposited with a polarisation voltage of −130V; the curve 504 corresponds to a plasma alumina film deposited with a polarisation voltage of −85V; the curve 505 corresponds to a plasma alumina film deposited with a polarisation voltage of −50V.

For all the depositions of the plasma alumina films, the number NB of cycles (cycle 1B illustrated in FIG. 2) is constant. In this example, $N_B$=125. The frequency of the measurement is 10 kHz, the scanning has been carried out from −5V to +5V then from +5V to −5V. The size of the terminals measured is 600 μm.

It results from these curves that the electric features of the alumina films, highly depend on the following conditions:
nature of the deposition: deposition in thermal mode or deposition in plasma mode, and
value of the polarisation voltage for the deposition in plasma mode.

The electric features impacted by these conditions are, in particular: the voltage of the curves, modification of the slope in the desertion regime, the hysteresis and also the maximum capacity.

To quantify these variations, the following parameters have been extracted from the C-Vs of FIGS. 5A and 5B:
the voltage of the forward curve for a capacity taken arbitrarily at 8×10-10 F. This feature is illustrated by the graph 601 of FIG. 6, the ordinate axis of which is referenced $V_{interp,forward}$;
the hysteresis between the forward and backward scanning for the same capacity. This feature is illustrated by the graph 602 of FIG. 6, the ordinate axis of which is referenced (Hysteresis V), and
the slope of the forward curve between a capacity of 5 and 8×10-10 F. This feature is illustrated by the graph 603 of FIG. 6, the ordinate axis of which referenced "forward slope".

Figure 6:
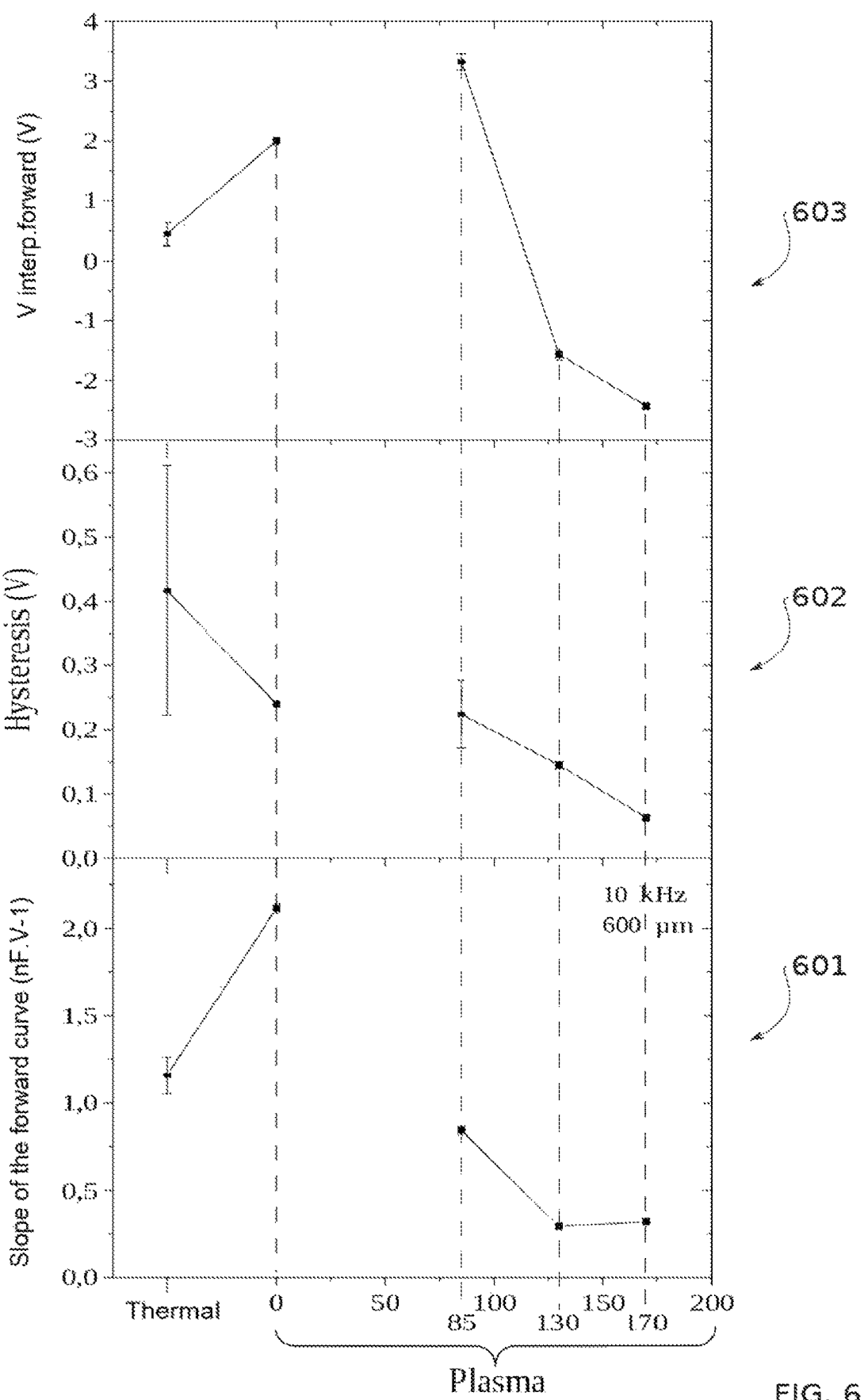
FIG. 6 comprises graphs, derived from the measurements of FIGS. 5B and 5A and illustrating the voltage of the forward curve for a given capacity, the hysteresis between the forward and backward scanning for a given capacity, as well as the slope of the forward curve.

According to FIG. 6, a clear improvement of the three parameters is observed, when the thermal alumina is compared with the plasma alumina deposited without polarisation voltage (polarisation voltage=0V). Indeed, by moving from thermal alumina to plasma alumina, an increase $V_{interp,forward}$ is noted (graph 603), which indicates an offsetting towards positive voltages of the C-Vs. It is the desired effect to obtain high electron mobility transistors (HEMTs) with a positive threshold ("normally-off") voltage. A decrease in hysteresis is also noted (graph 602) and an increase in the slope in the desertion regime (graph 601), synonymous of an improvement:
of the quality of the $Al_2O_3$/GaN interface between the alumina and the GaN layer on which the alumina rests, and
of the quality of the plasma alumina.

When the polarisation voltage varies from 0 to −170V, $V_{interp,forward}$ (graph 603) increases until a polarisation voltage of −85V then highly decreases. As regards the hysteresis (graph 602) and the slope in the desertion regime (graph 601), both decrease monotonously. Although a degradation of the slope, therefore of the $Al_2O_3$/GaN interface, is observed, the use of a polarisation voltage of −85V is appropriate to positively offset the C-V features.

Figure 7:
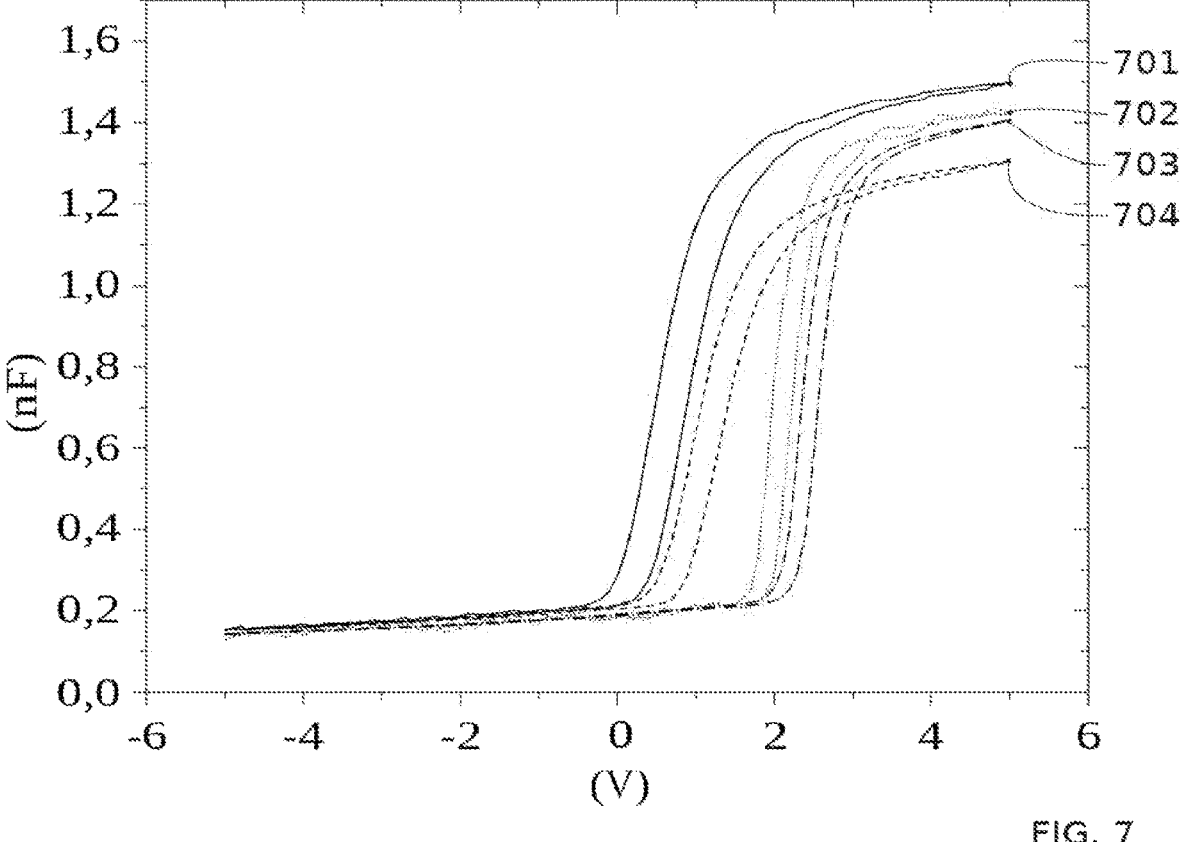
FIG. 7 is a graph illustrating the capacity-voltage (C-V) features of devices comprising only a thermal alumina layer or only a plasma alumina layer, or also a bilayer formed of a thermal alumina film and a plasma alumina film.

FIG. 7 makes it possible to compare the properties of the alumina bilayer comprising the thermal alumina film 71A and the plasma alumina film 71B with the alumina layers obtained by conventional thermal or conventional plasma method.

This FIG. 7 illustrates the C-V measurements of:
the alumina deposited by a thermal method (curve 701),
a plasma method (curve 702), and
methods combining thermal and plasma deposition (curves 703, 704).

The abscissa axis indicates the plasma alumina fraction in the overall alumina layer. Thus, when the plasma alumina fraction is zero, this means that the alumina layer is fully formed by a thermal deposition.

For all these depositions, the total number of cycles is, in this case also, 125. Depositions with plasma (curves 702, 703, 704) have been carried out without polarisation of the substrate (polarisation voltage=0V). The alumina layer of the curve 703 has been obtained by carrying out 10 thermal cycles 1A and 115 plasma cycles 1B. The alumina layer of the curve 704 has been obtained by carrying out 45 thermal cycles 1A and 80 plasma cycles 1B.

Figure 8:
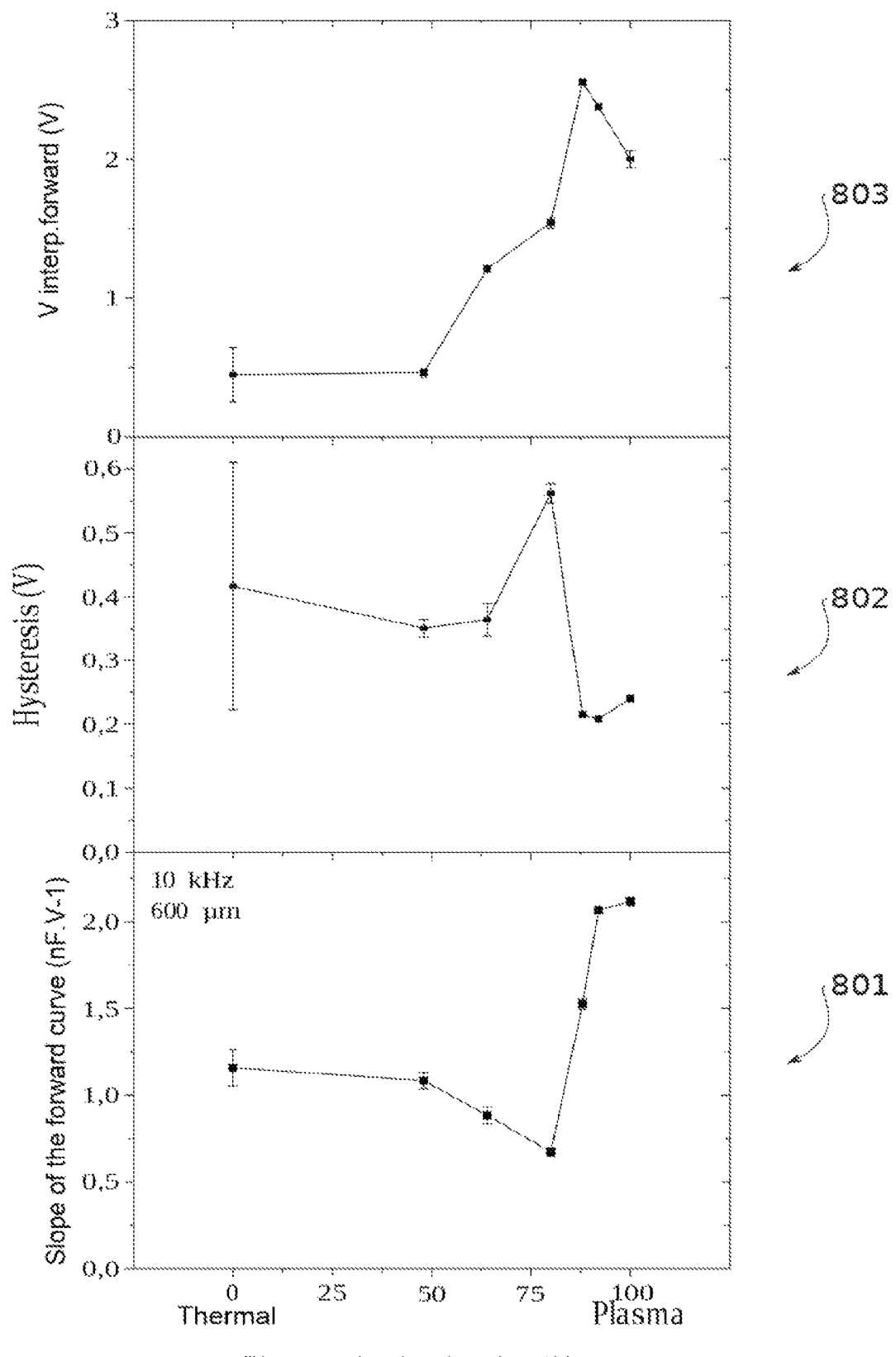
FIG. 8 comprises graphs, derived from the measurements of FIG. 6 and illustrating the voltage of the forward curve for a given capacity, the hysteresis between the forward and backward scanning for a given capacity, as well as the slope of the forward curve.

A significant variation of C-Vs is observed in this FIG. 8 for the different bilayers tested. To quantify these variations, the same parameters as above have been extracted from the C-Vs of FIG. 8 and brought together in FIG. 8 in the form of graphs 801, 802, 803.

This graph makes it possible to observe the clear improvement of the electric properties of the alumina layer achieved by implementing the method proposed, combining thermal mode deposition and plasma mode deposition. Indeed, the presence of a thin thermal alumina layer formed before the deposition of the plasma alumina makes it possible to obtain a clearly improved performance. More specifically, this bilayer structure makes it possible to obtain an increase $V_{interp,forward}$ (graph 803) while preserving an excellent slope of the forward curve (graph 801) and a very low hysteresis (graph 802). In this example, the thermal alumina layer 71A is thin. It is formed by carrying out 10 to 15 cycles. This leads to a thickness of about 0.8 to 1.2 nm for this layer.

It is probable that the thermal dielectric film, in this case, thermal alumina, plays the role of a protective layer vis-à-vis the surface 70' of the structure 70, in this case, GaN. This thermal film limits the oxidation of the surface of the GaN by the plasma and thus preserves the $Al_2O_3$/GaN interface. It is thus possible to improve the parameter $V_{interp,forward}$ while preserving the advantages of the plasma alumina seen above (excellent slope and low hysteresis). However, when a thickness which it too thick of thermal alumina is used, the properties of the total alumina dielectric layer approach those of the thermal alumina and thus being degraded. Thus, the alumina layer composed of thermal and plasma films makes it possible to improve the electric qualities of this layer, as well as the interface between this alumina layer and the underlying GaN structure.

Figure 9:
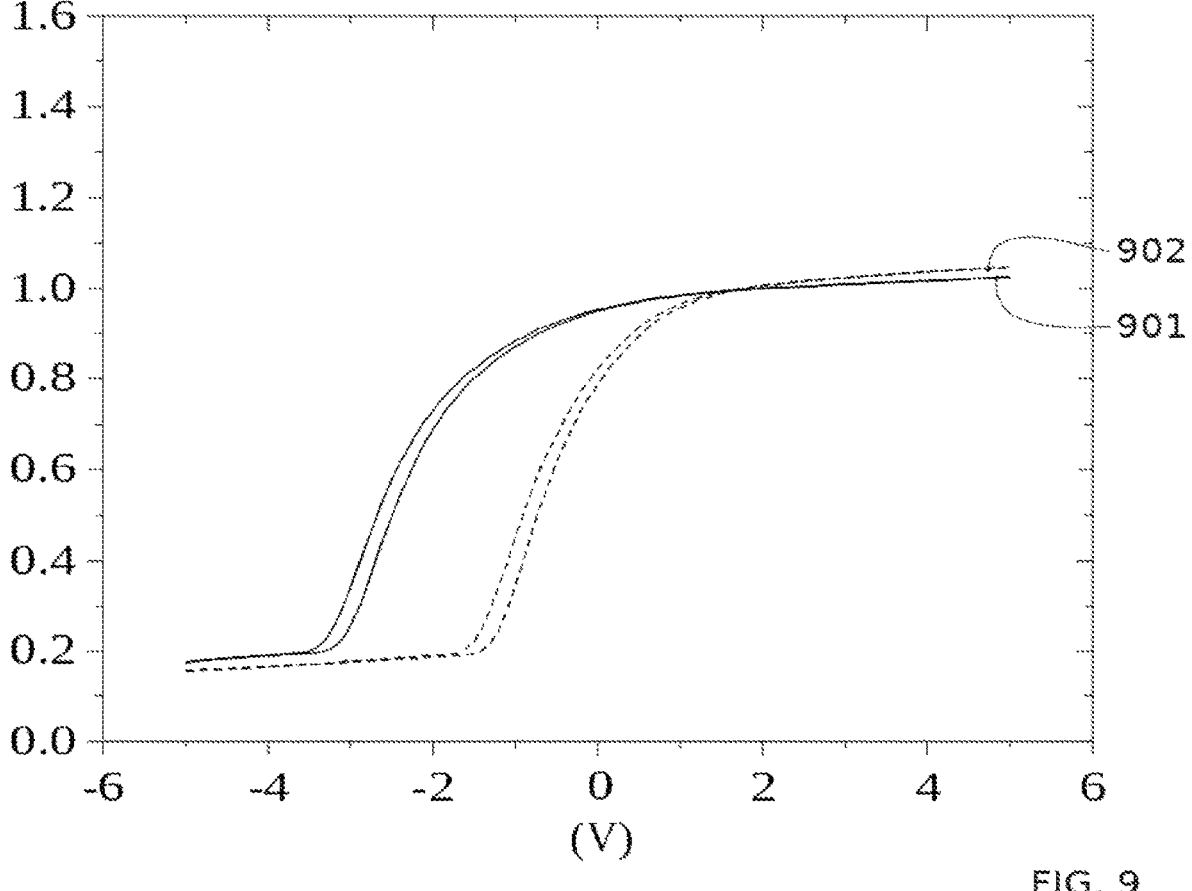
FIG. 9 is a graph illustrating the capacity-voltage (C-V) features of devices comprising an alumina bilayer formed of a thermal alumina film and a plasma alumina film. The devices studied differ by the relative proportion of the plasma alumina film with respect to the thermal alumina film, as well as by the polarisation voltage used for the deposition of the plasma alumina film.

FIG. 9 illustrates the C-V features for two different alumina layers. The curve 901 illustrates the C-V feature for an alumina layer only deposited by plasma with an average polarisation voltage of −130V. This alumina layer does not therefore comprise any thermal alumina film. The curve 902 illustrates the C-V feature for an alumina layer, forming a thermal alumina and plasma alumina bilayer. The thermal alumina film has been deposited by carrying out 15 thermal alumina cycles. The plasma alumina film has been deposited by carrying out 110 plasma alumina cycles with an average polarisation voltage of −135V.

It has been observed that the application of the polarisation voltage to the substrate $V_{bias-substrat}$ makes it possible to change the charge plane at the interface between the GaN and the gate stack and makes it possible to offset the threshold voltage to positive voltages.

It results from this FIG. 9 that, although a high voltage has been used, the alumina bilayer (curve 902) has properties higher than that of the plasma alumina layer (curve 901). In particular, a clear positive offsetting, of 2V, can be observed, while preserving a similar slope and hysteresis.

Particular Examples and Embodiment Variants

The paragraphs below aim to describe particular examples of embodiments of the present invention and to propose certain variants. The features and the examples and variants proposed below are applicable and can be combined with each of the examples mentioned above.

Injection of Precursors:
Nature of the Precursors

The aluminium-based precursors commonly used for ALD or PEALD can be used, such as trimethylaluminium or aluminium trichloride. These precursors can be used for thermal mode 1A and plasma mode 1B cycles.

For the formation of the plasma alumina, the precursor based on the given species can be dioxygen ($O_2$).
Injection Duration The injection duration of the precursors must be sufficiently long to saturate the exposed surface.

For example, the injection duration of the aluminium-based precursor is greater than or equal to 20 ms.

For thermal alumina, the injection duration of water or of ozone is, for example, greater than 50 ms ($10^{-3}$ seconds), preferably greater than or equal to 100 ms.

For plasma alumina, the duration of the dioxygen-based plasma is, for example, greater than 2 s, preferably greater than or equal to 5 s. These values make it possible to obtain a particularly high quality for the plasma film.
Pressure During the formation of thermal alumina, the pressure of the chamber during the injection of the precursors (water or precursor, ozone or aluminium-based) is at least 10 mTorr. Preferably, the pressure is about 80 mTorr.

During the formation of plasma alumina, the pressure of the chamber during the plasma must be adjusted so as to have a non-collisional sleeve. The pressure of the chamber during the injection of the aluminium-based precursor is at least 10 mTorr. Preferably, the pressure is about 80 mTorr. The pressure of the chamber during the plasma based on the given species is less than 50 mTorr. It is preferably between 5 and 20 mTorr. For example, it is about 15 mTorr.
Other Parameters of the Plasma The RF-ICP power must be sufficiently high to have a stable plasma. This power is preferably between 100-300 W. Preferably, is equal to 300 W. The plasma duration must be sufficiently long to enable the oxidation of the layer preceding the plasma.

As indicated above, the application of a polarisation voltage is only optional. If a polarisation voltage is applied, it is between −10V and −160V, preferably between −10V and −130V. Preferably, it is between −75V and −95V. Preferably, it is around −85V.
Purging Steps The purging steps use a neutral gas, preferably dinitrogen ($N_2$) or argon (Ar).

The purge duration must be sufficiently long to remove the excess reagent and/or subproducts from the reaction. Typically, it is of a several seconds, about 1.5 seconds for the step following the injection of the aluminium-based precursor. This purge duration is, for example:

4 seconds after injection of water,

At least 4 seconds after injection of ozone, 1.5 seconds after the dioxygen-based plasma.

The temperature range of the substrate on which the structure 70 rests is preferably between 200° C. and 350° C. Preferably, the substrate temperature is 300° C.
Parameters of the Dielectric Layer Forming a Bilayer:

The thermal alumina thickness $e_{71A}$ is preferably less than the thickness of the plasma alumina thickness $e_{71B}$.

Preferably, the thermal alumina thickness $e_{71A}$ is less than or equal to 2 nm. It is preferably greater than or equal to 0.5 nm. Preferably, it is equal to 1.2 nm. These values make it possible to have an effective protection against the oxidation of the underlying layer, typically GaN.

Preferably, the plasma alumina thickness $e_{71B}$ is greater than or equal to 5 nm. This makes it possible to have an overall dielectric layer having very good electric performances.

In view of the description above, it clearly appears that the method proposed offers a particularly effective solution for improving the quality of a dielectric layer, for example alumina, and for improving the quality of the interface of this dielectric layer with the structure which itself is underlying. The method proposed is thus particularly advantageous for producing alumina gate dielectrics, in order to manufacture high electron mobility transistors (HEMTs).

The invention is not limited to the embodiments described above, and extends to all the embodiments covered by the claims.

For example, in the preceding examples, the GaN-based layer on which the alumina-based layer is formed, is constituted of GaN. However, the present invention also extends to the embodiments, wherein the GaN-based layer on which the alumina-based layer is formed, is a layer made of a gallium nitride and at least one from among indium and aluminium. Thus, this GaN-based layer can be GaN, AlGaN, InGaN or AlInGaN.

The invention also extends to the embodiments, wherein the structure on which the dielectric layer, for example the alumina layer, is deposited is based on a material taken from among the materials 111-N other than a GaN-based layer.

Thus, all the examples, features, steps and technical advantages mentioned above in reference to a GaN-based structure are applicable to a structure based on a material taken from among the materials III-V.

Moreover, although the examples described in reference to FIGS. 3 to 8, the dielectric layer is an alumina layer, the invention also extends to methods which enable the production of a dielectric layer, other than alumina. Thus, this method can be implemented to produce a layer made of one of the following materials, or comprising one of the following materials: $HfO_2$, $ZrO_2$, $Ta_2O_5$, or $TiO_2$, $SiO_2$, SiN and AlN. In this case, the precursor used for the thermal deposition, for the plasma deposition can be taken from among one of the following materials: hafnium (Hf), titanium (Ti), zirconium (Zr), tantalum (Ta), silicon (Si).

Moreover, although the examples described in reference to FIGS. 3 to 8, the dielectric layer is formed by two films composed of identical materials (alumina in this non-limiting example), the invention also extends to the embodiments, wherein the first film is composed of a material different from that of the second film. For example, the first film/second film pair can be formed of one of the following pairs: $Al_2O_3/HfO_2$, $Al_2O_3/ZrO_2$, $Al_2O_3/TiO_2$, $Al_2O_3/SiO_2$.

Moreover, although in the examples described in reference to FIGS. 3 to 8, the given species on which the chemistry of the plasma is based, is oxygen-based, the invention extends to the case where this plasma is nitrogen-based.

Moreover, in the examples described above, the structure is a layer. However, all the examples, features, steps and technical advantages mentioned above in reference to a structure forming a layer are applicable to a structure not forming a layer, but forming an isolated structure, for example a three-dimensional raised part. The structure can be a nanostructure or comprise a plurality of nanostructures.

The invention claimed is:

1. A method for producing, on a structure based on a material III-V, a dielectric structure comprising at least one dielectric material that can be deposited by atomic layer deposition (ALD), the method carried out in a plasma reactor comprising a reaction chamber inside which said structure is disposed, the method comprising:

producing a first dielectric film by ALD by carrying out a plurality of first cycles each comprising at least:

an injection in the reaction chamber of a precursor based on a first material, and an injection in the reaction chamber of a water-based precursor, the first dielectric film comprising at least the first material and oxygen; and producing, on the first dielectric film, a second dielectric film by plasma-enhanced ALD by carrying out a plurality of second cycles, each comprising at least:

an injection in the reaction chamber of a precursor based on a second material, and an injection in the reaction chamber of a precursor based on a given species, taken from among oxygen and nitrogen, and the formation in the reaction chamber of a plasma based on said species, the second dielectric film comprising at least the second material and said species, wherein the plurality of first cycles and the plurality of second cycles are performed sequentially in situ in the reaction chamber.

2. The method according to claim 1, wherein the first material is identical to the second material.

3. The method according to claim 1, wherein the first material is different from the second material.

4. The method according to claim 1, wherein at least one from among the first material and the second material is taken from among one of the following materials: aluminium, titanium, hafnium, tantalum, zirconium, and silicon.

5. The method according to claim 1, wherein the first dielectric film is taken from among the following materials: $Al_2O_3$, $HfO_2$, $TiO_2$, $Ta_2O_5$, $ZrO_2$, $SiO_2$, and SiN.

6. The method according to claim 1, wherein the second dielectric film is taken from among the following materials: $Al_2O_3$, $HfO_2$, $TiO_2$, $Ta_2O_5$, $ZrO_2$, $SiO_2$, SiN, and AlN.

7. The method according to claim 1, wherein the first material and the second material are aluminium, the first dielectric film and the second dielectric film are made of $Al_2O_3$.

8. The method according to claim 1, wherein the plasma based on said species is an oxygen-based plasma created from a precursor constituted of dioxygen or comprising dioxygen.

9. The method according to claim 1, wherein the plasma based on said species is a nitrogen-based plasma created from a precursor constituted of dinitrogen or comprising dinitrogen.

10. The method according to claim 1, wherein the precursor based on the first material and the precursor based on the second material are taken from among trimethylaluminium and aluminium trichloride.

11. The method according to claim 1, wherein the first dielectric film has a thickness $e_{71A}$ and the second dielectric film has a thickness $e_{71B}$, with $e_{71A} < e_{71B}$.

12. The method according to claim 1, wherein the first dielectric film has a thickness $e_{71A}$, such that $e_{71A} \geq 0.5$ nm.

13. The method according to claim 1, wherein the first dielectric film has a thickness $e_{71A}$, such that $e_{71A} \leq 1.7$ nm ($10^{-9}$ metres).

14. The method according to claim 1, wherein the second dielectric film has a thickness $e_{71A}$, such that $e_{71A} \geq 5$ nm.

15. The method according to claim 1, wherein each second cycle comprises, at least one step of purging the reaction chamber, the purging step comprising the injection in the reaction chamber of a neutral gas, the at least one purging step being carried out at at least one of the following moments:

after the injection of the precursor based on the second material and before the formation of the plasma, and after the formation of the plasma.

16. The method according to claim 1, wherein each second cycle comprises at least one step of stabilising gases present in the reaction chamber, the stabilisation step being carried out at least before the formation of the plasma.

17. The method according to claim 1, wherein said structure is disposed on a substrate located in the reaction chamber, and, during the formation of the plasma, a polarisation voltage is applied to the substrate.

18. The method according to claim 17, wherein the absolute value of the polarisation voltage is less than or equal to 160 Volts.

19. The method according to claim 17, wherein the polarisation voltage is between −75V and −95V.

20. The method according to claim 1, wherein the structure is based on a material III-N.

21. The method according to claim 20, wherein the structure is gallium nitride-based.

22. The method according to claim 1, wherein the structure comprises GaN, the first dielectric film comprises $Al_2O_3$ having a thickness between 0.5 and 1.7 nm, and the structure is disposed on a substrate located and, during the formation of the plasma, a polarisation voltage less than 130V is applied to the substrate.

23. The method according to claim 22, wherein the second dielectric film comprises $Al_2O_3$.

* * * * *